United States Patent [19]
Majumdar et al.

[11] Patent Number: 5,706,189
[45] Date of Patent: Jan. 6, 1998

[54] METHOD OF DRIVING A POWER CONVERTER

[75] Inventors: Gourab Majumdar; Shinji Hatae, both of Tokyo, Japan

[73] Assignee: Mitsubishi Denki Kabushiki Kaisha, Tokyo, Japan

[21] Appl. No.: 675,719

[22] Filed: Jul. 2, 1996

[30] Foreign Application Priority Data

Feb. 15, 1996 [JP] Japan .................................. 8-027613

[51] Int. Cl.$^6$ .................................................. H02M 7/219
[52] U.S. Cl. .......................... 363/95; 363/37; 363/98; 363/132
[58] Field of Search ............................. 363/34, 37, 49, 363/950, 98, 132

[56] References Cited

U.S. PATENT DOCUMENTS

| | | | |
|---|---|---|---|
| 4,794,508 | 12/1988 | Carroll | 363/95 |
| 5,155,670 | 10/1992 | Brian | 363/98 |

FOREIGN PATENT DOCUMENTS 55 112038  8/1980  Japan.

*Primary Examiner*—Jeffrey L. Sterrett
*Attorney, Agent, or Firm*—Oblon, Spivak, McClelland, Maier & Neustadt, P.C.

[57] ABSTRACT

Disclosed is a method of driving a power converter which can simplify a charging sequence of a charge pump capacitor to reduce the time required to design the device without using a voltage protective circuit and optimum design required to determine the capacitance of the charge pump capacitor. A charging pulse signal for a capacitor (CP) is provided as an input signal from an external control device (EC) substantially simultaneously as a control power source (PS) is switched on to provide a predetermined control power source voltage ($V_{PS}$). A driver circuit (DR20) outputs a control signal ($V_D$) to turn on a transistor (Q2) in a pulse-like manner, starting charging the capacitor (CP). The charging pulse signal continues being provided after completion of the charging of the capacitor (CP) and stops being provided immediately before a PWM signal is provided.

3 Claims, 7 Drawing Sheets

METHOD OF DRIVING A POWER CONVERTER

BACKGROUND OF THE INVENTION

1. Field of the Invention

The present invention to a method of driving a power converter. More particularly, the invention relates to a method of driving a power converter which reduces unstable operation ran generated in a switching device.

2. Description of the Background Art

Figure 6:
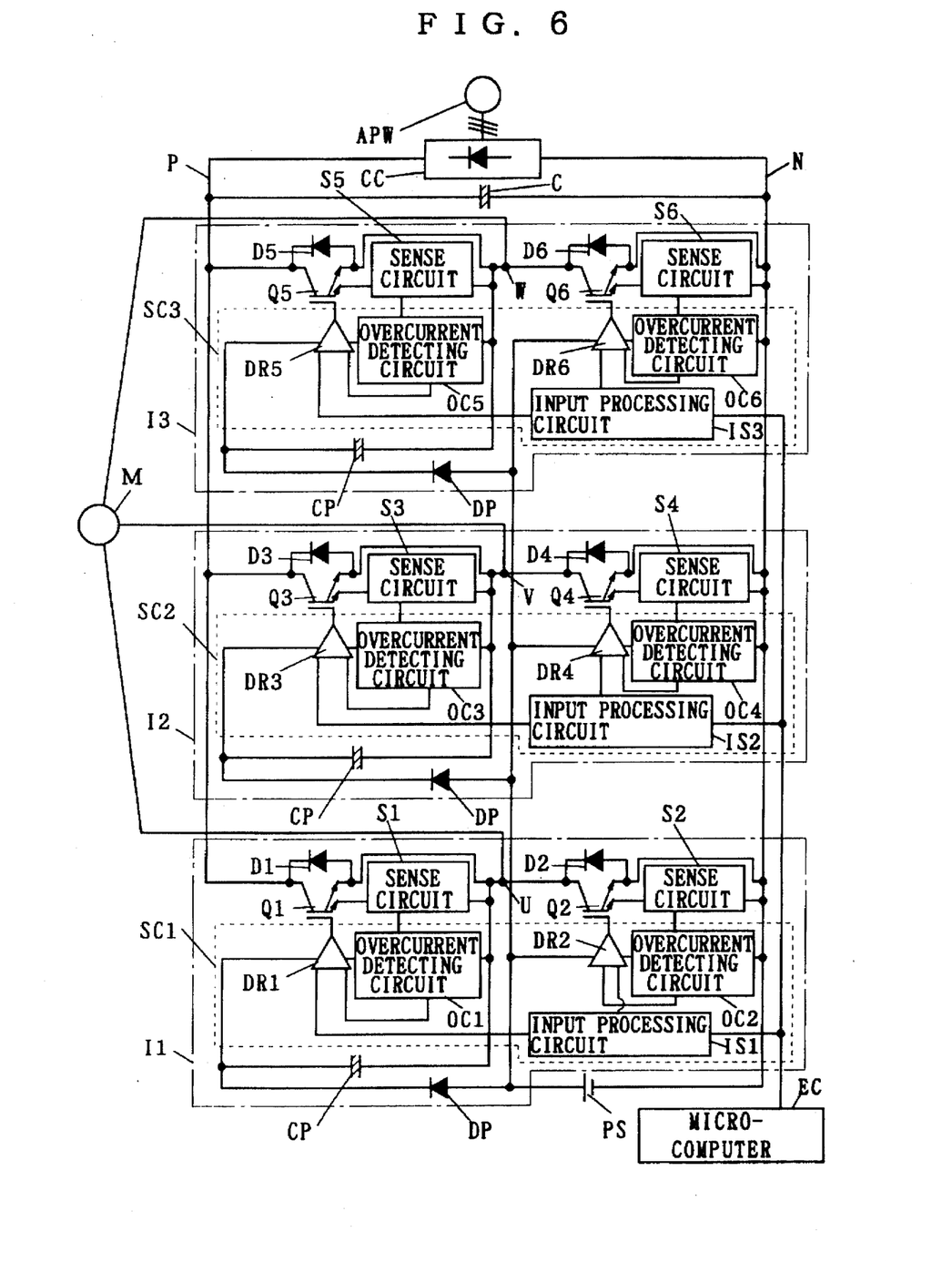
FIG. 6 is a diagram of a drive circuit for an AC input three-phase motor to which a conventional method of driving a power converter is applied.

FIG. 6 is a diagram of a drive circuit for an AC input thee-phase motor. As illustrated in FIG. 6, an AC three-phase power supply APW serving as a power supply for an AC input three-phase motor M is connected to a converter circuit CC connected between lines P and N. Inverter circuits I1, I2, I3 serving as power converters are connected to the respective phases of the AC input three-phase motor M.

The inverter circuit I1 (I2, I3) comprises a pair of transistors Q1, Q2 (Q3, Q4; Q5, Q6) which are power devices such as IGBTs (insulated gate bipolar transistors) totem-pole connected between the lines P and N, and a control circuit SC1 (SC2, SC3). Connecting points U, V, W of the totem-pole connected transistors are connected to the inputs of the respective phases of the motor M. Free-wheeling diodes D1 to D6 are connected inverse-parallel with the transistors Q1 to Q6, respectively. A smoothing capacitor C is connected between the lines P and N. The converter circuit CC rectifies the alternating current from the AC three-phase power supply APW to provide a voltage which is referred to as a main power supply voltage.

The construction of the inverter circuit I1 is described below. With reference to FIG. 6, the node U serving as the output of the inverter circuit I1 is connected between the totem-pole connected transistors Q1 and Q2. The control circuit SC1 includes a high potential circuit and a low potential circuit, with the node U functioning as a boundary therebetween.

The high potential circuit comprises a driver circuit DR1 for controlling the transistor Q1, and an over current detecting circuit OC1 for detecting an overcurrent flow through the transistor Q1 to feed back information about the overcurrent to the driver circuit DR1. The driver circuit DR1 and the overcurrent detecting circuit OC1 use the potential at the node U as a reference. The potential at the node U is approximate to a main power supply potential $V_{CC}$ (e.g., 600 V) when the transistor Q1 is in the ON state. Conventionally, an LVIC (low-voltage IC) constituting the control circuit operates at a voltage of 30 V or less and is not constructed to withstand a voltage as high as 600 V. Thus, the reference potential of the control circuit SC1 is held floating from the ground potential, and the 600 V main power supply potential acts as a reference potential when the transistor Q1 is in the ON state.

The low potential circuit comprises a driver circuit DR2 for controlling the transistor Q2, an overcurrent detecting circuit OC2 for detecting an overcurrent flow through the transistor Q2 to feed back information about the overcurrent to the driver circuit DR2, and an input processing circuit IS1 receiving an input signal (a drive signal for the transistors Q1, Q2) from an external control device EC such as a microcomputer and for performing suitable signal processing to provide an output to the driver circuits DR1 and DR2. The driver circuit DR2, the overcurrent detecting circuit OC2, and the input processing circuit IS1 use the ground potential as a reference.

The control circuits SC2 and SC3 are similar in construction and function to the control circuit SC1 and include like components designated with different reference characters. Thus, the description of the control circuits SC2 and SC3 will be dispensed with.

As described above, the high potential circuits in the control circuits SC1 to SC3 are held floating from the ground potential and have a reference potential substantially equal to the main power supply potential. To supply power to drive the high potential circuits, a bootstrap circuit which is one form of charge pump circuits is suitable.

The bootstrap circuit includes a diode DP and a capacitor CP both for charge pumping having a high breakdown voltage characteristic (for example, a breakdown voltage of 800 V or more). The diode DP has an anode connected to a positive electrode of a control power supply PS using the ground potential as a reference, and a cathode connected to the driver circuit DR1. The capacitor CP is connected between the cathode of the diode DP and the node U.

The operation of the bootstrap circuit is discussed below. When the transistor Q1 is in the OFF state and the transistor Q2 is in the ON state, the potential at the node U is approximate to the ground potential GND, and there is a current flow from the control power supply PS through the diode DP, the capacitor CP, and the transistor Q2 to the ground potential GND. Part of this current functions as a charging current for the capacitor CP to develop a voltage depending on the charge across the capacitor CP. The voltage across the capacitor CP is substantially equal to the voltage generated by the control power supply PS because of a small forward to the voltage generated by the control power supply PS because of a small forward voltage drop in the diode DP. Then, a voltage corresponding to the voltage generated by the control power source PS is applied to the driver circuit DR1.

When the transistor Q1 is in the ON state and the transistor Q2 is in the OFF state, the potential at the node U is substantially equal to the main power supply potential $V_{CC}$, and the potential at the node of the diode DP and capacitor CP is higher than the potential at the node U by the amount of the voltage across the capacitor CP. As above stated, the voltage across the capacitor CP is substantially equal to the voltage generated by the control power source PS. Then, a voltage corresponding to the voltage generated by the control power source PS is applied to the drive circuit DR1. The capacitor CP is discharged in some amounts by supplying the supply power to the driver circuit DR1. However, turning the transistor Q1 to the OFF state and the transistor Q2 to the ON state again causes the control power source PS to charge to compensate for the discharging of the capacitor CP.

In this manner, if the transistors Q1 and Q2 alternately turn on to vary the potential at the node U between the power supply potential $V_{CC}$ and the ground potential GND, the bootstrap circuit supplies the potential higher than the potential at the node U by the amount of relatively substantially constant voltage to the driver circuit DR1.

The use of the bootstrap circuit permits the single control power source PS in the low potential circuit to effect the operation of the high and low potential circuits in the control circuits SC1 to SC3 to control the transistors Q1 and Q2, achieving the unification of the control power source. In recent years, by using the above stated bootstrap circuit, power converters which the control power source is unified have been prevailing to achieve reduction in device size and cost.

Figure 7A:
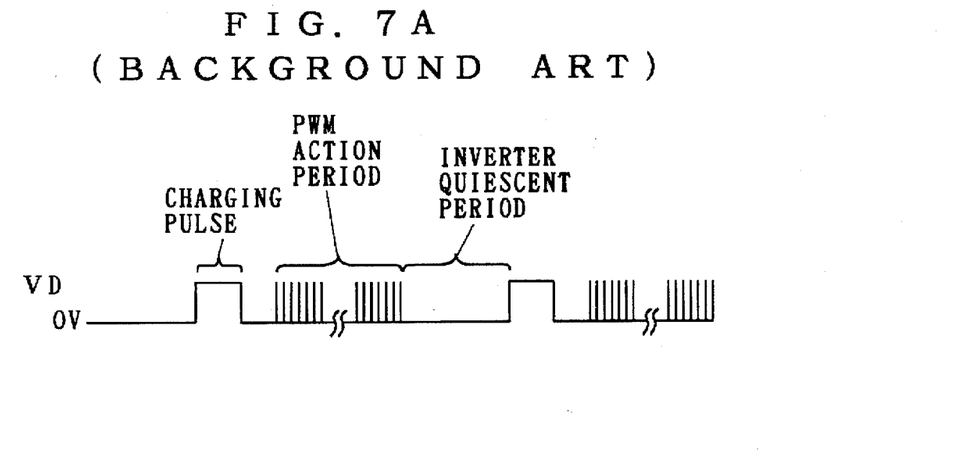
FIGS. 7A to 7C are timing charts for illustrating the conventional method.
Figure 7B:
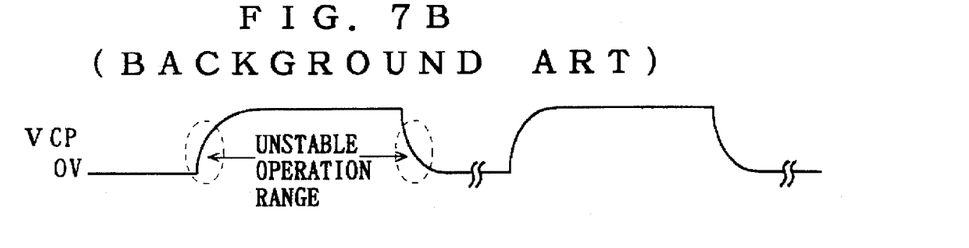
Figure 7C:
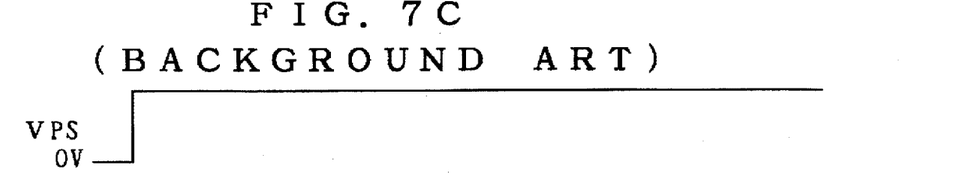

The conventional operation of the power converter which the control power source is unified, by using the bootstrap circuit will be described using the inverter circuit I1 as an example with reference to the timing charts of FIGS. 7A to 7C.

The operation of the above described bootstrap circuit is described using a current flow. Turning the transistor Q2 to the ON state forms a current path from the control power source PS through the diode DP and the capacitor CP to the transistor Q2. The capacitor CP is charged to drive the transistor Q1. The charging sequence of the capacitor CP must be executed prior to the start of a conventional PWM (pulse width modulation) action.

The course of operation is described with reference to FIGS. 7A to 7C. At the time when the control power source PS is switched on as shown in FIG. 7C, no input signal is provided from the external control device EC and, hence, the potential $V_C$ of the capacitor CP is 0 V as shown in FIG. 7B. When a charging pulse signal for the capacitor CP is provided as the input signal prior to the PWM action as shown in FIG. 7A, the driver circuit DR2 outputs a control signal $V_D$ to turn on the transistor Q2, starting charging the capacitor CP. Upon completion of charging the capacitor CP, the charging pulse signal stops and a PWM signal for the PWM action is provided instead. When the PWM action is completed, the inverter circuit I1 enters a quiescent period and the capacitor CP is not charged but left discharged to reduce power consumption. For purposes of convenience, the control signal $V_D$ outputted in response to the charging pulse signal from the external control device EC is illustrated as the charging pulse signal, and the time period over which the control signal $V_D$ outputted in response to the PWM signal is provided is illustrated as a PWM action period in FIG. 7A. pulse signal for the capacitor CP is provided as an input signal V to start charging the capacitor CP.

As above described, the conventional operation of the power converter which the control power source is unified, by using the bootstrap circuit includes a repeat of the charging of the capacitor CP, the PWM action, and the discharging of the capacitor CP. The capacitance of the capacitor CP when the device is designed is determined by the relation between the discharging amount (the amount of power consumption of the control circuit SC1) by the PWM action and the charging amount by the charging pulse signal. An increase in capacitance of the capacitor CP allows the execution of the PWM action without problems but lowers the charging and discharging speeds before and after the PWM action.

The low charging speed means that it takes much time for voltage to reach a level at which the transistors Q1 and Q2 serving as output devices perform stable operation, and the low discharging speed means a long time period over which voltage causes an unstable operation of the transistors Q1 and Q2, that is, a wide unstable operation range of the output devices. Thus, the determination of the capacitance of the capacitor CP is closely associated with not only an operating temperature range and the wiring resistance of a circuit pattern but also the charging sequence such as a charging pulse signal width, resulting in complicated and difficult device design.

The unstable operation range of the transistors Q1 and Q2 is described below. When the transistor Q1 turns on due to noises or the like during the charging of the capacitor CP, an arm short circuit (short circuit between the lines P and N) occurs. Then, sense outputs of the transistors Q1 and Q2 provide an overcurrent signal at a predetermined level. Sense circuits S1 and S2 pick up the overcurrent signal to apply the overcurrent signal to the overcurrent detecting circuits OC1 and OC2, respectively. The overcurrent detecting circuits OC1 and OC2 apply a feedback signal to the driver circuits DR1 and DR2 so that the transistors Q1 and Q2 turn off to prevent the thermal breakdown of the transistors Q1 and Q2, respectively (overcurrent protective operation).

Unfortunately, if the gate voltage of the transistor Q1 is low during the charging of the capacitor CP, the overcurrent signal from the sense output of the transistor Q1 is at a low level, resulting in thermal breakdown of the transistor Q1 due to overcurrent before the overcurrent signal reaches the predetermined level. The voltage range lower than the gate voltage sufficient to effect the stable operation of the transistor Q1 is referred to as the unstable operation range. General-purpose inverters which are often used to repeat starting and stopping the PWM action cause a large number of unstable operation ranges, resulting in strong likelihood of the output device breakdown.

Figure 8:
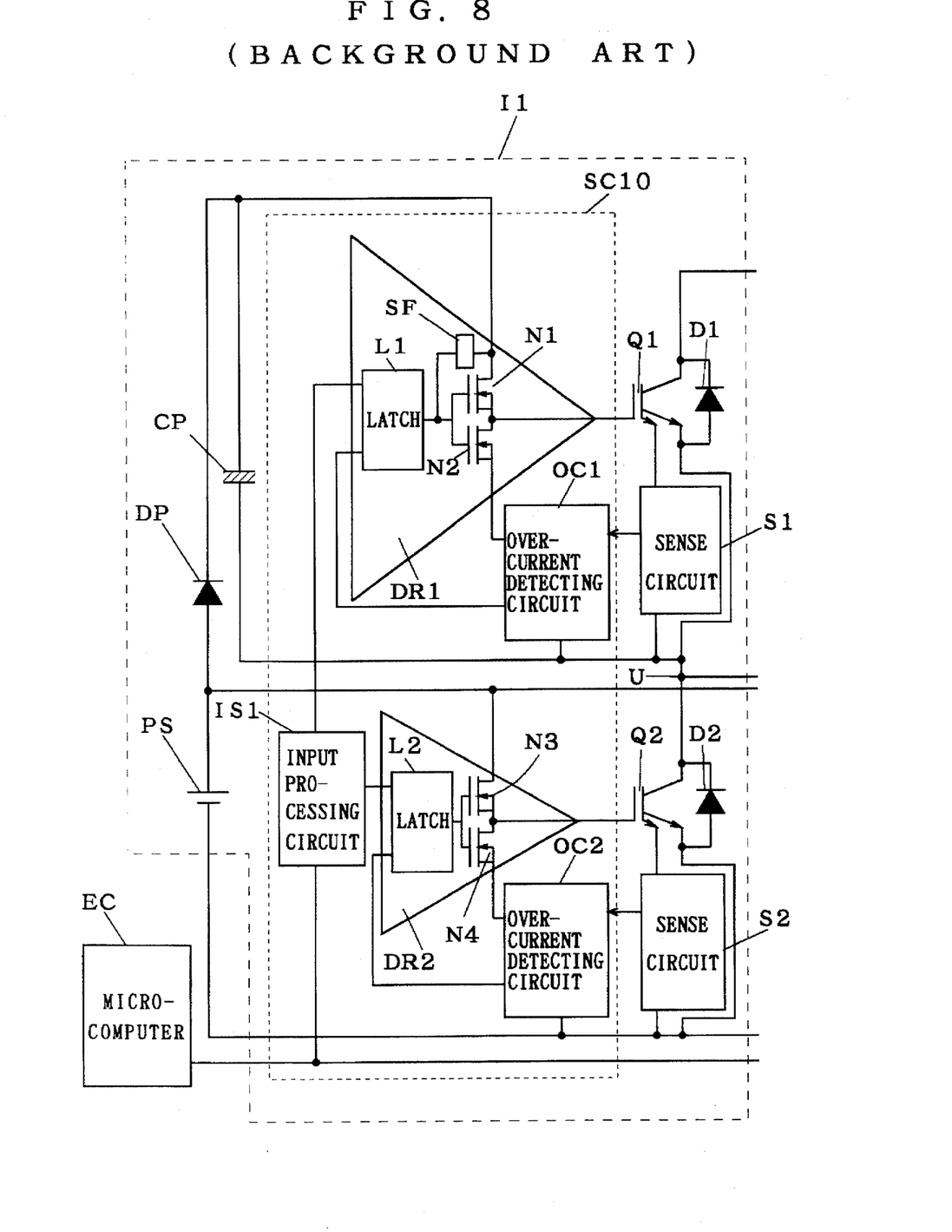
FIG. 8 is a diagram of the power converter to which the conventional method is applied.

To prevent the arm short circuit of the transistors Q1 and Q2 in the unstable operation range, there has been provided a voltage protective circuit within the driver circuit DR1. FIG. 8 illustrates the structure of the driver circuits DR1 and DR2.

Referring to FIG. 8, the driver circuit DR1 comprises a latch circuit L1, totem-pole connected NMOS transistors N1 and N2, and a voltage protective circuit SF connected between the drain terminal of the NMOS transistor N1 and the output terminal of the latch circuit L1. The latch circuit L1 has a first input connected to the input processing circuit IS1, and a second input connected to a feedback signal output terminal of the overcurrent detecting circuit OC1. The drain electrode of the NMOS transistor N1 is connected to the cathode of the diode DP, and the source NMOS transistor N1 is connected to the cathode of the diode DP, and the source electrode of the NMOS transistor N2 is connected to the overcurrent detecting circuit OC1. A node connecting the NMOS transistors N1 and N2 is connected to the gate electrode of the transistor Q1. The driver circuit DR2 is similar in construction to the driver circuit DR1 except that the driver circuit DR2 does not comprise the voltage protective circuit SF, and the description of the driver circuit DR2 will be dispensed with. In some cases, the voltage protective circuit SF can be added to the driver circuit DR2.

The voltage protective circuit SF allows the driver circuit DR1 to provide an output only when the voltage of the capacitor CP is higher than a predetermined level. The provision of the voltage protective circuit SF prevents the transistor Q1 from being in the ON state if noises are applied thereto during the charging of the capacitor CP.

However, it is difficult to reduce the size of the voltage protective circuit SF having a large occupied area which goes against the current of development intended for one-chip (monolithic) structure for size reduction of the whole device.

SUMMARY OF THE INVENTION

A first aspect of the present invention is intended for a method of driving a power converter, the power converter including first and second switching devices which are connected in series and interposed between first and second main power supply potentials, bootstrap type power supply means using a potential at a connecting node of the first and second switching devices as a reference, a power source using the second main power supply potential as a reference, and first and second drive means for driving the first and second switching devices, respectively, in response to an input signal from external input signal generating means, the first drive means using power supplied from the bootstrap type power supply means as power for driving the first switching device, the second drive means using power supplied from the power source as power for driving the second switching device, the bootstrap type power source means including a diode and a capacitor, the diode having an anode connected to a positive output of the power source, and a cathode connected to a first power input portion of the first drive means, the capacitor having a first electrode connected to the first power input portion of the first drive means, and a second electrode connected to a second power input portion of the first drive means, and the connecting node, the connecting node for providing an output, the input signal including a charging pulse signal or causing the second switching device to conduct in a pulse-like manner to charge the capacitor, and a PWM signal for placing the first and second switching devices into an PWM action. According to the present invention, the method comprises the step of: continuously providing the charging pulse signal when the power source is in the ON state and the PWM signal is not provided after completion of charging the capacitor.

Preferably, according to a second aspect of the present invention, the charging pulse signal starts being provided substantially simultaneously as the power source is switched on.

Preferably, according to a third aspect of the present invention, the charging pulse signal starts being provided immediately before the PWM signal starts being provided after the power source is switched on.

According to the method of driving the power converter of the first aspect of the present invention, the charging pulse signal is continuously provided after the completion of the charging of the capacitor of the bootstrap type power supply means until the first and second switching devices enter a PWM action period to perform the PWM action. After the power source is switched on, the charging pulse signal is continuously provided while the PWM signal is not provided. Thus, the operation to completely charge the completely discharged capacitor and the operation to completely discharge the completely charged capacitor are in one-to-one corresponding relation to switching on and off the power source. Two unstable operation ranges of the first and second switching devices before the capacitor voltage reaches a predetermined voltage are generated for each switch-on and -off of the power source. This greatly reduces the likelihood that the first and second switching devices conduct simultaneously while the capacitor voltage is within the unstable operation range and are then damaged. The greatly reduced rate of the damages eliminates the need for means for preventing damages to the switching devices, such as a voltage protective circuit, which has been provided in at least one of the first and second drive means, to reduce the size of the first and second drive means and, accordingly, the size of the whole power converter. The charging sequence of the capacitor is simplified to eliminate the need for optimum design required to determined the capacitance of the capacitor, reducing the time required to design the device.

According to the method of driving the power converter of the second aspect of the present invention, the charging pulse signal starts being provided substantially simultaneously as the power source is switched on. This greatly simplifies the charging sequence of the capacitor to further reduce the labor required to establish the sequence.

According to the method of driving the power converter of the third aspect of the present invention, the charging pulse signal is continuously provided switched on. If there is a long time interval between switching on the power source and starting the PWM action period, the charging pulse signal is prevented from being provided unnecessarily, reducing power consumption.

It is therefore an object of the present invention to provide a method of driving a power converter which can simplify a charging sequence of a charge pump capacitor to reduce the time required for device design without using a voltage protective circuit and optimum design required to determine the capacitance of the charge pump capacitor.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1:
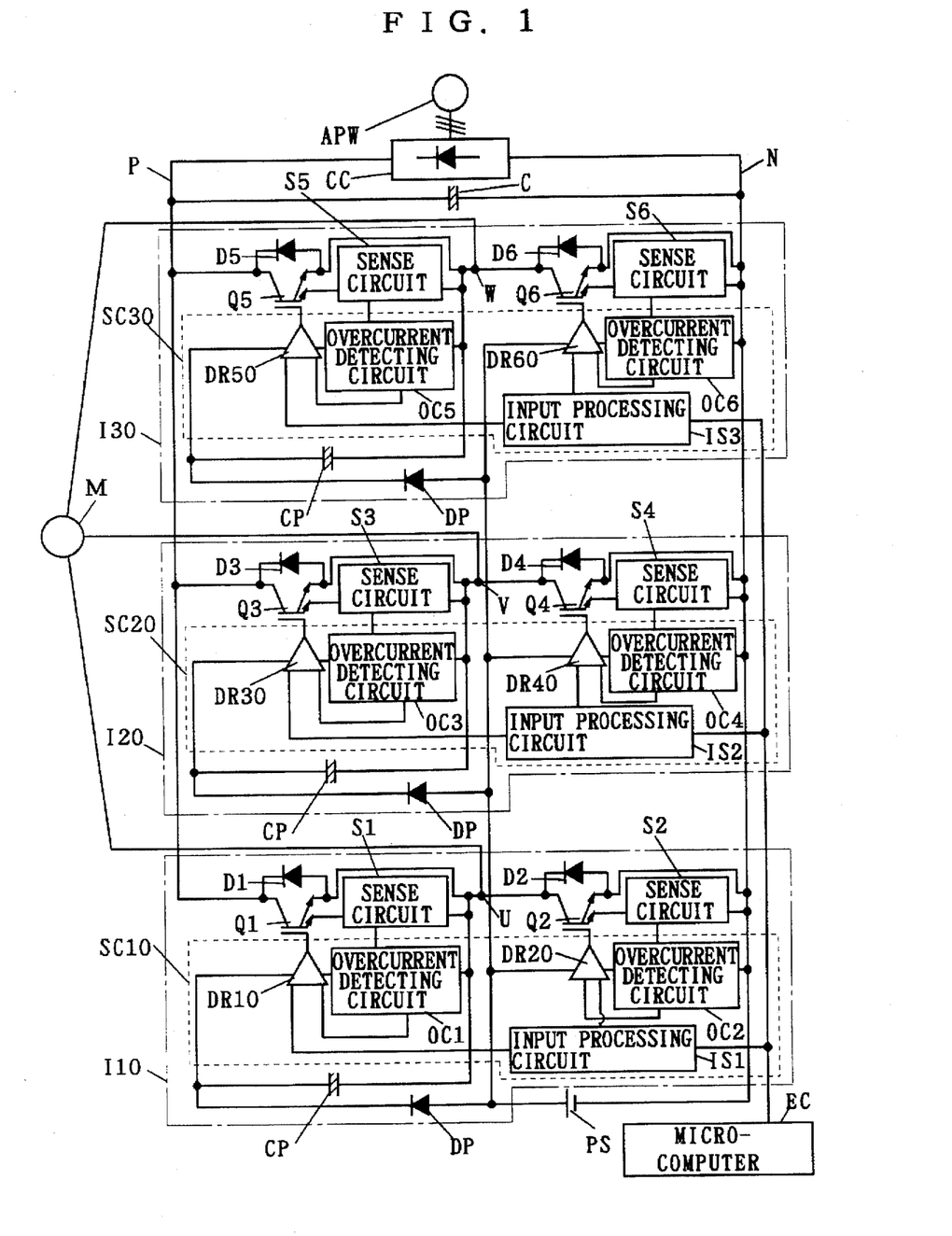
FIG. 1 is a diagram of a drive circuit for an AC input three-phase motor to which a method of driving a power converter according to the present invention is applied.

FIG. 1 is a diagram of a drive circuit for an AC input three-phase motor. Referring to FIG. 1, an AC three-phase power supply APW serving as a power supply for an AC input three-phase motor M is connected to a converter circuit CC connected between lines P and N. Inverter circuits I10, I20, I30 serving as power converter are connected to respective phases of the AC input three-phase motor M.

The inverter circuits I10, I20, I30 comprise pairs of transistors Q1, Q2; Q3, Q4; Q5, Q6 which are power devices such as IGBTs (insulated gate bipolar transistors) totem-pole connected between the lines P and N, and control circuits SC10, SC20, SC30 for controlling the conduction of the associated transistors, respectively. The inputs of the respective phases of the motor M are connected to nodes U, V, W of the totem-pole connected transistors Q1, Q2; Q3, Q4; Q5, Q6, respectively. Free-wheeling diodes D1 to D6 are connected in inverse-parallel with the transistors Q1 to Q6, respectively. A smoothing capacitor C is connected between the lines P and N. The converter circuit CC rectifies the alternating current from the AC three-phase power supply APW to provide a voltage which is referred to as a main power supply voltage.

The structure of the inverter circuit I10 is discussed below. With reference to FIG. 1, the node U serving as the output of the inverter circuit I10 is connected between the totem-pole connected transistors Q1 and Q2. The control circuit SC10 includes a high potential circuit and a low potential circuit, with the node U functioning as a boundary therebetween.

The high potential circuit comprises a driver circuit DR10 for driving the transistor Q1, and an overcurrent detecting circuit OC1. If there is an overcurrent flow through the transistor Q1, the overcurrent detecting circuit OC1 extracts the overcurrent through a sense circuit S1 connected to a sense output of the transistor Q1 to apply the information about the overcurrent as a feedback signal to the driver circuit DR1. The driver circuit DR10 and the overcurrent detecting circuit OC1 use as a reference the potential at the node U which is approximate to a main power supply potential $V_{CC}$ (e.g., 600 V) while the transistor Q1 is in the ON state. In general, an LVIC (low potential IC) constituting the control circuit operates at a voltage of 30 V or less and is not constructed to withstand a voltage as high as 600 V. Thus, the reference potential of the control circuit SC10 is held floating from the ground potential, and the 600 V main power supply potential acts as a reference potential when the transistor Q1 is in the ON state.

The low potential circuit comprises a driver circuit DR20 for driving the transistor Q2, an overcurrent detecting circuit OC2, and an input processing circuit IS1. If there is an overcurrent flow through the transistor Q2, the overcurrent detecting circuit OC2 extracts the overcurrent through a sense circuit S2 connected to a sense output of the transistor Q2 to apply information about the overcurrent as a feedback signal to the driver circuit DR20. The input processing circuit IS1 receives an input signal (finally outputted as a control signal for the transistors Q1 and Q2 from the driver circuits DR10 and DR20) from an external control device EC such as a microcomputer and performs suitable signal processing to apply an output to the driver circuits DR10 and DR20. The driver circuit DR20, the overcurrent detecting circuit OC2, and the input processing circuit IS1 use the ground potential as a reference.

The input processing circuit IS1 includes a level shift circuit for level-shifting or converting the input signal which uses the ground potential as a reference into a level-shifted signal which uses the main power supply potential as a reference in order to apply the input signal to the driver circuit DR10 in the high potential circuit. The construction of the level shift circuit is remotely related to the present invention, and the description thereof will be dispensed with. The control circuits SC20 and SC30 are similar in construction and function to the control circuit SC10 and include like components designated with different reference characters. Thus, the description of the control circuits SC20 and SC30 will be dispensed with.

A bootstrap circuit comprises a diode DP and a capacitor CP which have a high breakdown voltage characteristic (e.g., a breakdown voltage of 800 V or more). The diode DP has an anode connected to a positive electrode of a control power source PS using the ground potential as a reference, and a cathode connected to the driver circuit DR10. The capacitor CP is connected between the cathode of the diode DP and the node U.

Figure 2:
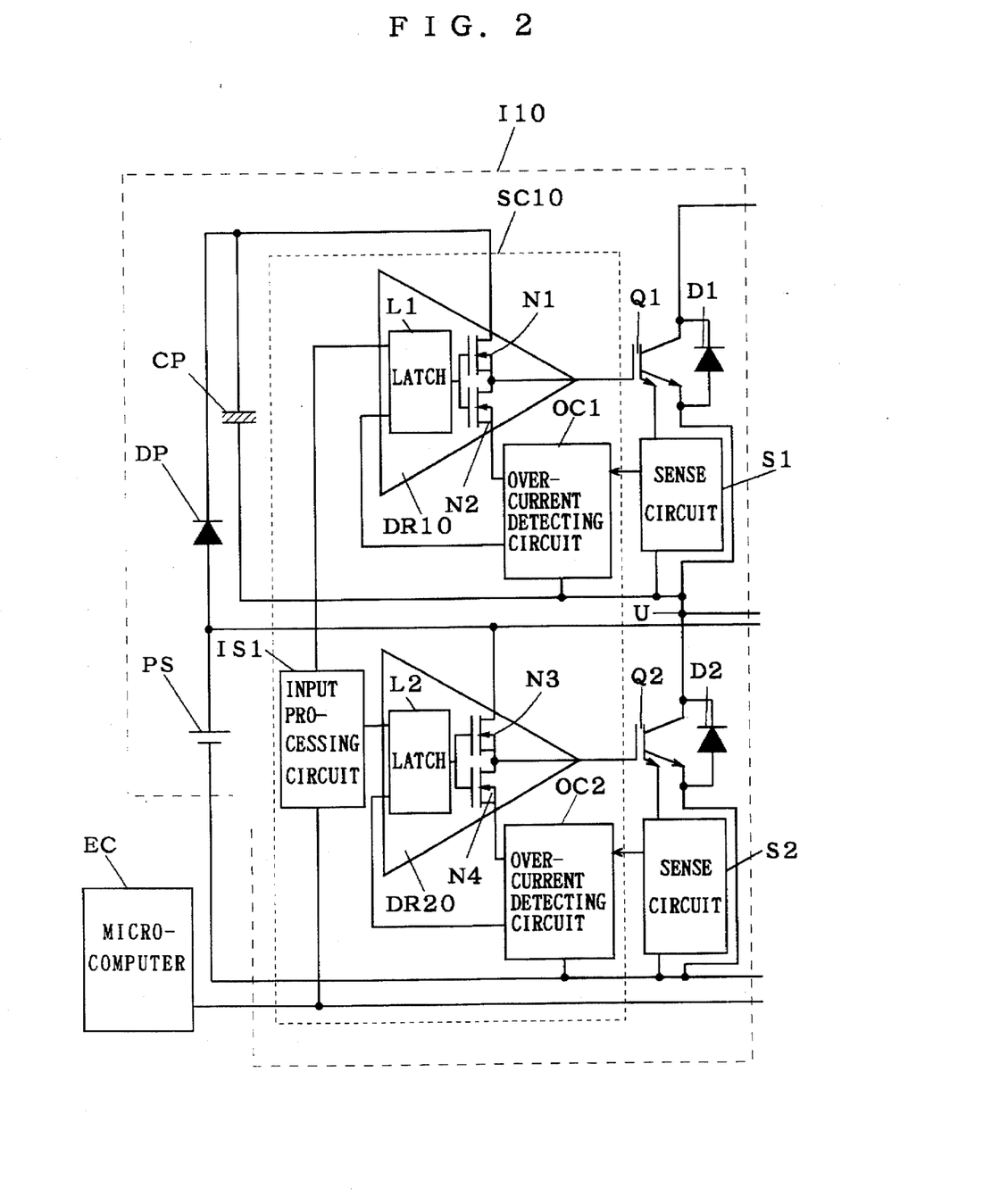
FIG. 2 is a diagram of the power converter to which the method of the present invention is applied.

FIG. 2 illustrates the structure of the driver circuits DR10 and DR20 in the inverter I10. Referring to FIG. 2, the driver circuit DR10 comprises a latch circuit L1, and totem-pole connected NMOS transistors N1 and N2. The latch circuit L1 has a first input connected to the input processing circuit IS1, and a second input connected to a feedback signal output terminal of the overcurrent detecting circuit OC1. The NMOS transistor N1 has a drain electrode connected to the cathode of the diode DP. The NMOS transistor N2 has a source electrode connected to the overcurrent detecting circuit OC1. The connecting node of the NMOS transistors N1 and N2 is connected to the gate electrode of the transistor Q1. The driver circuit DR20 is similar in construction to the driver circuit DR10 and includes like components designated with different reference characters. Thus, the description of the driver circuit DR20 will be dispensed with.

Figure 3:
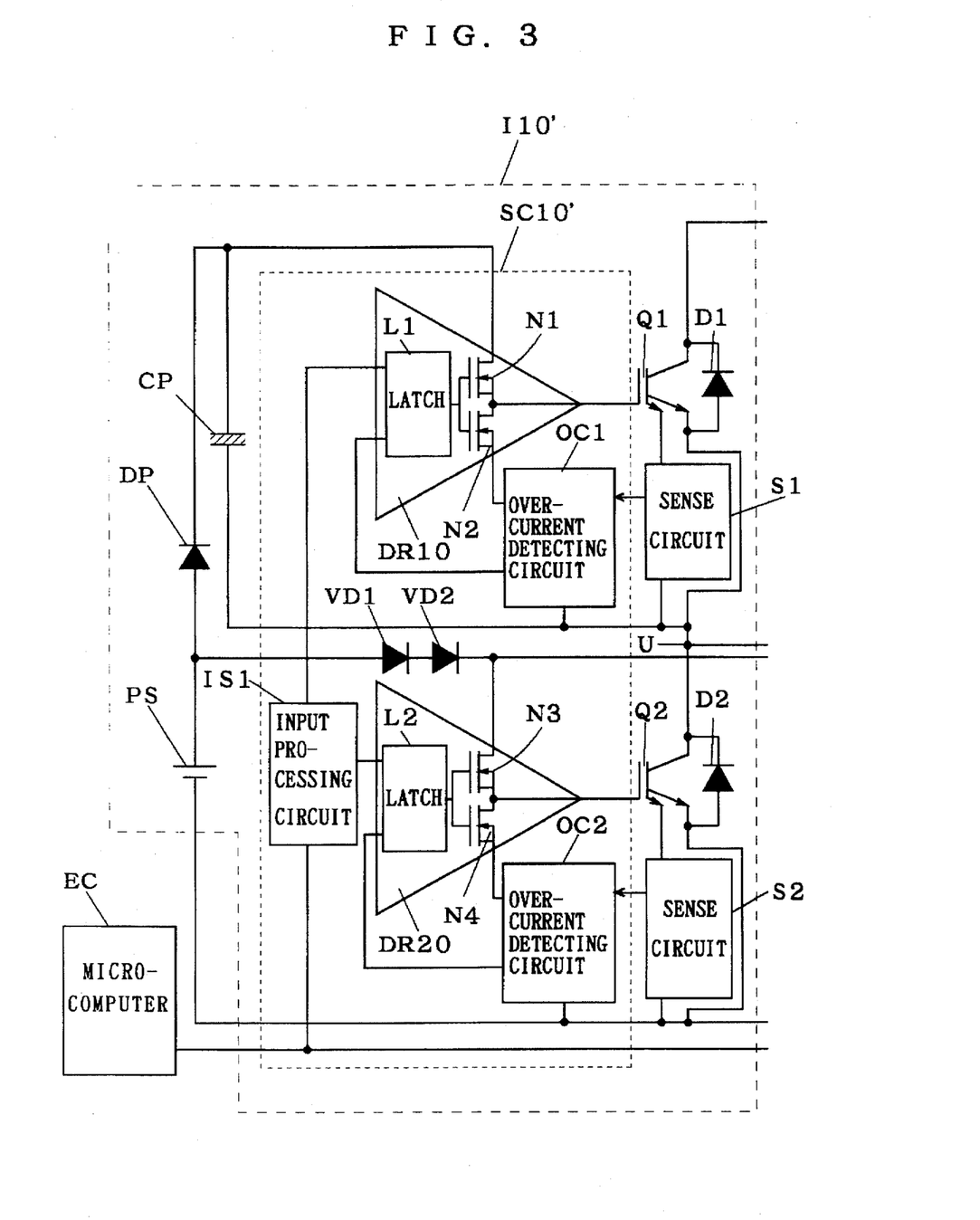
FIG. 3 is a diagram of the power converter of another form to which the method of the present invention is applied.

FIG. 3 shows an inverter circuit I10' which is a variation of the inverter circuit I10. In the inverter circuit I10 shown in FIG. 2, the positive electrode of the control power source PS is connected directly to the drain electrode of an NMOS transistor N3 in the low potential circuit. In the inverter circuit I10', however, voltage dropping diodes VD1 and VD2 are connected in series in the forward direction between the positive electrode of the control power source PS and the drain electrode of the NMOS transistor N3. Other elements of the inverter circuits I10' are identical with those of the inverter circuit I10, and the description thereof will be dispensed with.

The presence of the voltage dropping diodes VD1 and VD2 allows the drive voltage for the transistor Q1 applied from the bootstrap circuit to the driver circuit DR10 to be substantially equal to the drive voltage for the transistor Q2 applied from the control power source PS to the driver circuit DR20, eliminating unbalanced conditions of the operation of the transistors Q1 and Q2 resulting from the difference in drive voltage.

The above stated inverter circuits I10 and I10' employ the totem-pole connected NMOS transistors N1, N2; N3, N4 which, however, may be replaced with totem-pole connected PMOS transistors.

The operation of the inverter circuit I10 according to a method of driving the power converter of a first preferred embodiment of the present invention will be described with reference to the timing charts of FIGS. 4A to 4C.

Figure 4A:
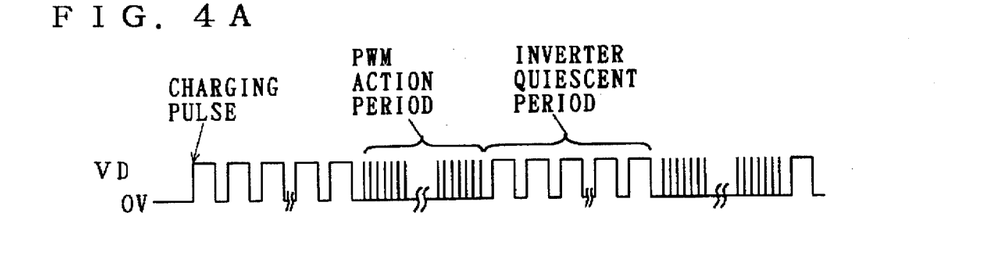
FIGS. 4A to 4C are timing charts for illustrating the method according to a first preferred embodiment of the present invention.
Figure 4B:
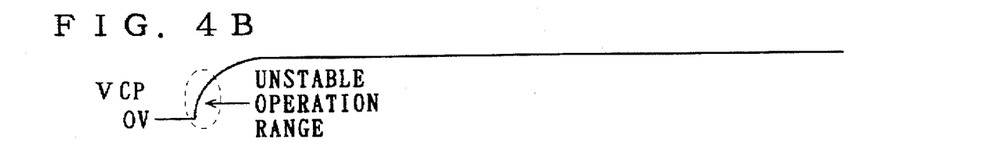
Figure 4C:
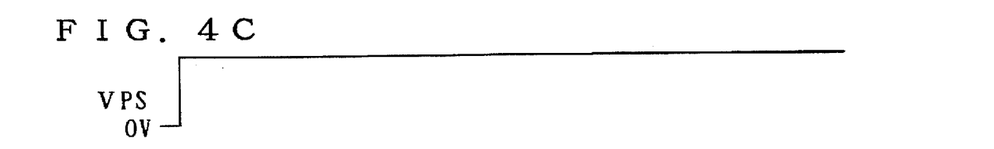

A charging pulse signal for the capacitor CP is provided as an input signal from the external control device EC substantially simultaneously as the control power source PS is switched on to provide a predetermined control power source voltage $V_{PS}$ as shown in FIG. 4C. A control signal $V_D$ is outputted from the driver circuit DR20 as shown in FIG. 4A to turn on the transistor Q2 in a pulse-like manner, starting the charging of the capacitor CP as shown in FIG. 4B. The charging pulse signal is provided also after the completion of the charging of the capacitor CP and stops immediately prior to the output of a PWM signal.

For purposes of convenience, the control signal $V_D$ outputted in response to the charging pulse signal from the external control device EC is illustrated as the charging pulse signal, and the time period over which the control signal $V_D$ outputted in response to the PWM signal from the external control device EC is provided is illustrated as a PWM action period in FIG. 4A.

Upon completion of the PWM action, the inverter circuit I10 enters a quiescent period. However, since the charging pulse signal for the capacitor CP is provided again, the capacitor CP is held charged. To re-start the PWM action by the inverter circuit I10, it is unnecessary to charge the capacitor CP, and there is no unstable operation range of the output device due to charging.

The pulse width of the charging pulse signal is determined in consideration for the capacitance of the capacitor CP. Setting a long pulse width which permits completion of the charging of the capacitor CP during the presence of one pulse prolongs the time period over which the charging pulse signal is provided, that is, the time period over which the transistor Q2 is in the ON state, resulting in the strong likelihood of turn-on of the transistor Q1 and the strong likelihood of damages to the transistors Q1 and Q2 due to arm short circuit. Setting the pulse width so that the charging of the capacitor CP is completed during the presence of a plurality of pulses may shorten the time period over which the transistor Q2 is in the ON state to lower the likelihood of damages to the transistors Q1 and Q2.

<Characteristic Function and Effect>

In this manner, continuously providing the charging pulse signal for the quiescent time period of the inverter circuit I10 allows the capacitor CP to be held charged as long as the control power source PS is in the ON state. Thus, the unstable operation range is developed only when the control power source PS is switched on to start charging and when the control power source PS is switched off to discharge. This greatly reduces the likelihood of damages to the transistors Q1 and Q2 due to arm short circuit.

While the charging voltage of the capacitor CP is within the unstable operation range, there is a low likelihood that the transistors Q1 and Q2 are subjected to arm short circuit due to noises or the like. As above stated, in the conventional method of driving the power converter, the number of unstable operation ranges is equal to the number of repeated starts and stops of the PWM action to cause the strong likelihood of damages to the output devices due to arm short circuit, requiring the voltage protective circuit SF. In the method of driving the power converter according to the present invention, however, the unstable operation ranges of the transistors Q1 and Q2 occur only when the control power source PS is switched on to start charging, minimizing the likelihood of the arm short circuit in the transistors Q1 and Q2. There is no need to provide the voltage protective circuit to facilitate the size reduction of the device and to simplify the charging sequence of the capacitor CP. This eliminates the need to perform optimum design required to determined the capacitance of the capacitor CP to reduce the time required to design the device.

<Second Preferred Embodiment>

Figure 5A:
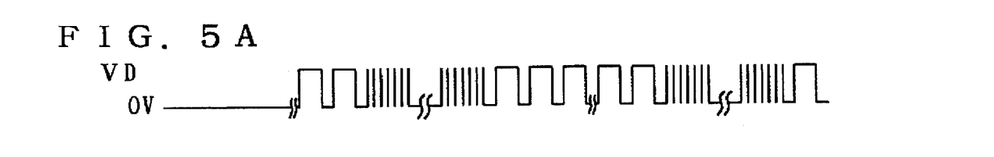
FIGS. 5A to 5C are timing charts for illustrating the method according to a second preferred embodiment of the present invention.
Figure 5B:
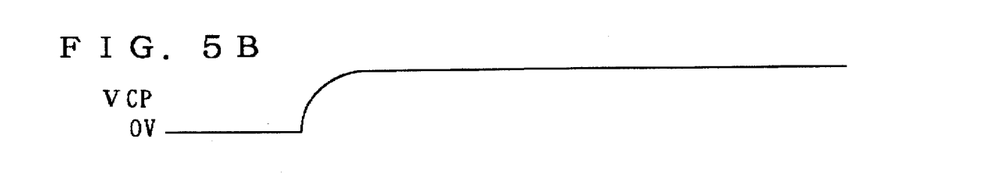
Figure 5C:
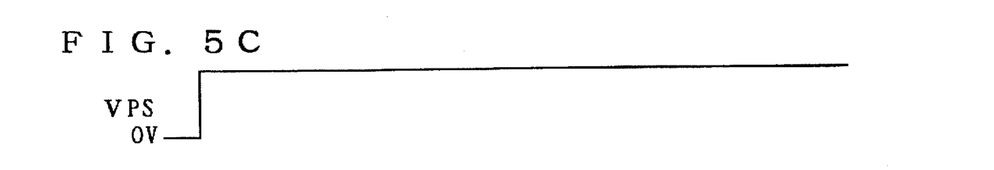

The operation of the inverter circuit I10 according to the method of driving the power converter of a second preferred embodiment of the present invention will be described with reference to the timing charts of FIGS. 5A to 5C.

In the method of the first preferred embodiment of the present invention, the charging pulse signal for the capacitor CP is provided as an input signal $V_{IN}$ from the external control device EC substantially simultaneously as the control power source PS is switched on to provide the predetermined control power source voltage $V_{PS}$. However, the charging pulse signal for the capacitor CP may be provided from the external control device EC as shown in FIG. 5A after a predetermined time has elapsed since the control power source PS is switched on as shown in FIG. 5C. Since a charging pulse signal having such a short width that the charging of the capacitor CP is not completed during the presence of one pulse must be provided a plurality of times until the capacitor CP is completely charged, the timing to start providing the charging pulse signal should be determined in consideration for the pulse width and the capacitance of the capacitor CP.

<Characteristic Function and Effect>

In the method of driving the power converter of the second preferred embodiment of the present invention, as above described, the charging pulse signal is prevented from being unnecessarily provided when there is a long time interval between switching on the power supply PS and providing the PWM signal, reducing power consumption.

While the invention has been described in detail, the foregoing description is in all aspects illustrative and not restrictive. It is understood that numerous other modifications and variations can be devised without departing from the scope of the invention.

We claim:

1. A method of driving a power converter, said power converter including first and second switching devices which are connected in series and interposed between first and second main power supply potentials, bootstrap type power supply means using a potential at a connecting node of said first and second switching devices as a reference, a power source using said second main power supply potential as a reference, and first and second drive means for driving said first and second switching devices, respectively, in response to an input signal from external input signal generating means, said first drive means using power supplied from said bootstrap type power supply means as power for driving said first switching device, said second drive means using power supplied from said power source as power for driving said second switching device, said bootstrap type power supply means including a diode and a capacitor, said diode having an anode connected to a positive output of said power source, and a cathode connected to a first power input portion of said first drive means, said capacitor having a first electrode connected to said first power input portion of said first drive means, and a second electrode connected to a second power input portion of said first drive means and said connecting node, said connecting node for providing an output, said input signal including a charging pulse signal for causing said second switching device to conduct in a pulse-like manner to charge said capacitor, and a PWM signal for placing said first and second switching devices into an PWM action, said method comprising the step of:

continuously providing said charging pulse signal when said power source is in the ON state and said PWM signal is not provided after completion of charging said capacitor.

2. The method of claim 1, wherein said charging pulse signal starts being provided substantially simultaneously as said power source is switched on.

3. The method of claim 1, wherein said charging pulse signal starts being provided immediately before said PWM signal starts being provided after said power source is switched on.

* * * * *